(12) United States Patent
Miura

(10) Patent No.: US 10,851,968 B2
(45) Date of Patent: Dec. 1, 2020

(54) LIGHT EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/423,153

(22) Filed: May 28, 2019

(65) Prior Publication Data

US 2019/0368685 A1 Dec. 5, 2019

(30) Foreign Application Priority Data

May 29, 2018 (JP) .................................. 2018-102074

(51) Int. Cl.
| | | |
|---|---|---|
| F21V 5/00 | (2018.01) | |
| F21V 5/04 | (2006.01) | |
| F21V 7/00 | (2006.01) | |
| F21V 13/04 | (2006.01) | |
| H01S 5/00 | (2006.01) | |
| H01S 5/022 | (2006.01) | |
| H01S 5/40 | (2006.01) | |
| F21Y 115/30 | (2016.01) | |

(52) U.S. Cl.
CPC ............. F21V 5/045 (2013.01); F21V 7/0066 (2013.01); F21V 13/04 (2013.01); H01S 5/005 (2013.01); H01S 5/02236 (2013.01); H01S 5/02292 (2013.01); H01S 5/4093 (2013.01); F21Y 2115/30 (2016.08)

(58) Field of Classification Search
CPC ........ F21V 7/0066; F21V 13/04; F21V 5/045; F21V 5/08; H01S 5/005; H01S 5/02236; H01S 5/02292; H01S 5/4093; H01S 5/02288; F21Y 2115/30

See application file for complete search history.

(56) References Cited

U.S. PATENT DOCUMENTS

| 5,606,181 A | 2/1997 | Sakuma et al. |
|---|---|---|
| 2004/0184280 A1 | 9/2004 | Ishida et al. |
| 2005/0225995 A1 | 10/2005 | Komatsu et al. |

(Continued)

FOREIGN PATENT DOCUMENTS

| DE | 102004062913 A1 | 7/2006 |
|---|---|---|
| JP | 2000-242192 A | 9/2000 |

(Continued)

*Primary Examiner* — Y. M. Quach Lee
(74) *Attorney, Agent, or Firm* — Global IP Counselors, LLP

(57) ABSTRACT

A light emitting device includes a first light emitting element, a first light reflecting member and a lens member. The first light reflecting member is positioned with respect to the first light emitting element so that emitted light from the first light emitting element is divided into a portion of the emitted light from the first light emitting element irradiating onto the light reflecting face and a portion of the emitted light from the first light emitting element traveling outside of the light reflecting face by having an edge of the light reflecting face serve as a boundary. The lens member includes a reflected light passing region having a first lens shape configured to control the travelling direction of reflected light, and a non-reflected light passing region having a second lens shape configured to control a travelling direction of non-reflected light.

19 Claims, 8 Drawing Sheets

(56) References Cited

U.S. PATENT DOCUMENTS

| | | | |
|---|---|---|---|
| 2013/0021581 A1* | 1/2013 | Takahashi | F21V 9/00 |
| | | | 362/231 |
| 2013/0083553 A1 | 4/2013 | Sekiguchi | |
| 2013/0329397 A1* | 12/2013 | Shimizu | F21V 13/04 |
| | | | 362/84 |
| 2016/0341395 A1 | 11/2016 | Kiyota et al. | |
| 2018/0331495 A1* | 11/2018 | Nakano | H01S 5/02288 |

FOREIGN PATENT DOCUMENTS

| | | |
|---|---|---|
| JP | 2005-235841 A | 9/2005 |
| JP | 2007-114459 A | 5/2007 |
| JP | 2007-287610 A | 11/2007 |
| JP | 2010-067380 A | 3/2010 |
| JP | 2016-219779 A | 12/2016 |
| JP | 2018-097966 A | 6/2018 |
| WO | 2017145229 A1 | 8/2017 |

* cited by examiner

LIGHT EMITTING DEVICE

CROSS-REFERENCE TO RELATED APPLICATION

This application claims priority to Japanese Patent Application No. 2018-102074, filed on May 29, 2018, the disclosure of which is hereby incorporated by reference in its entirety.

BACKGROUND

The present disclosure relates to a light emitting device.

The use of a lens in collecting, dispersing, or collimating the emitted light from a light emitting element has been known. For example, Japanese Unexamined Patent Publication No. 2010-67380 discloses an automotive light where the emitted light from a light emitting element enters a projection lens by way of a reflector or not by way of the reflector before being externally output.

SUMMARY

In the case of the light emitting device disclosed in the patent reference mentioned above, however, both the light reflected by the reflector and the light not reflected by the reflector pass through the same lens structure. For this reason, optical output controls, such as collecting, dispersing, and collimating light cannot be applied distinctively to reflected light and non-reflected light.

A light emitting device according to the present disclosure includes a first light emitting element, a first light reflecting member and a lens member. The first light emitting element is configured to emit light. The first light reflecting member has a light reflecting face configured to reflect light. The first light reflecting member is positioned with respect to the first light emitting element so that emitted light from the first light emitting element is divided into a portion of the emitted light from the first light emitting element irradiating onto the light reflecting face and a portion of the emitted light from the first light emitting element traveling outside of the light reflecting face by having an edge of the light reflecting face serve as a boundary. The lens member is configured to control a travelling direction of the emitted light from the first light emitting element. The lens member includes a reflected light passing region having a first lens shape configured to control the travelling direction of reflected light, which is the portion of the emitted light reflected by the light reflecting face, and a non-reflected light passing region having a second lens shape configured to control a travelling direction of non-reflected light, which is the portion of the emitted light travelling outside the light reflecting face.

According to the light emitting device related to the present disclosure, optical output controls, such as collecting, dispersing, and collimating light, can be distinctively performed on reflected light and non-reflected light.

DESCRIPTION OF EMBODIMENTS

Figure 1:
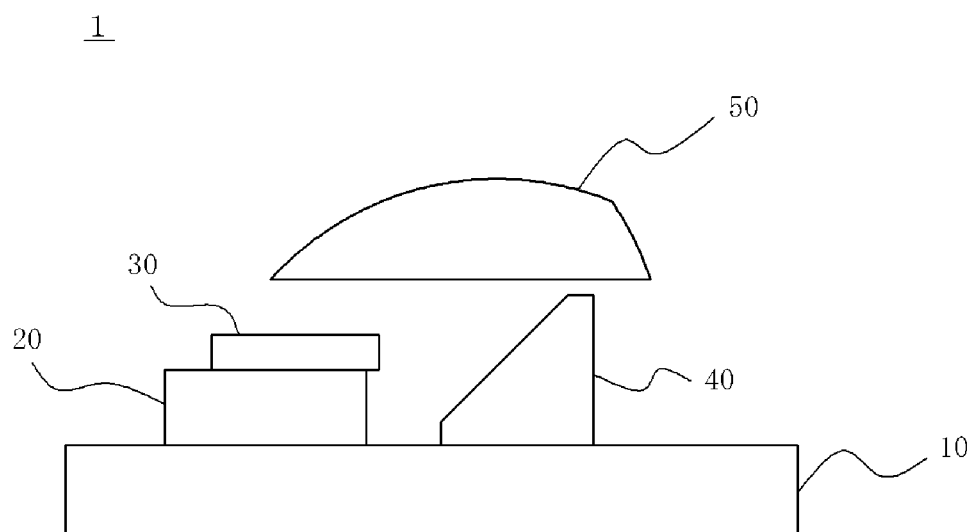
FIG. 1 is a schematic diagram of the light emitting device according to a first embodiment.

Certain embodiments of the present disclosure will be explained below with reference to the drawings. The embodiments below, however, are described for the purpose of giving shape to the technical ideas of the present disclosure, and are not intended to require to the present disclosure. In the explanation below, moreover, the same designations and reference numerals show the same members or those similar in character for which explanations will be omitted as appropriate. The sizes of and relative positions of the members in each diagram may be exaggerated for clarity of explanation.

First Embodiment

FIG. 1 is a schematic diagram of the light emitting device 1 according to a first embodiment. The light emitting device 1 includes a base 10, at least one submount 20, at least one semiconductor laser element 30, at least one light reflecting member 40, and at least one lens member 50. In the light emitting device 1, the submount 20, the semiconductor laser element 30, the light reflecting member 40, and the lens member 50 are arranged on the planar face of the base 10. Moreover, the component-disposing surface (the planar face in this example) of the base 10 on which the light reflecting member 40 is disposed is used as a reference surface. The lens member 50 is disposed further upwards of the semiconductor laser element 30 and the light reflecting member 40 disposed on the component-disposing surface serving as the reference surface. The constituent elements of the light emitting device 1 will be explained below. The term, "upwards," in the description herein refers to the direction in which the semiconductor laser element 30 is disposed using the component-disposing surface of the base 10 as a reference.

The base 10 has a planner face on which the submount 20 and the light reflecting member 40 directly disposed. The semiconductor laser element 30 is disposed on the planar face of the base member 10 via the submount 20. In the description herein, the state where a member is directly disposed on a certain face, or placed on another object that is directly disposed on the planar face, will be expressed as "disposing a member on the surface". In other words, the state where a member is placed on and physically connected to the surface with or without an intermediate therebetween will be described as the member being disposed on the face.

The word, "directly", will be used in the case of specifically noting the state where a member is directly disposed on a surface. If not specifically noted, it means that it may be either.

The base 10 has electrodes for electrically connecting the semiconductor laser element 30 to an external power source, and the semiconductor laser element 30 will be electrically connected to the electrodes. The base 10 thus has a function of electrically connecting the semiconductor laser element 30 to an external power source. For the base 10, a ceramic, metal, composite of these, or the like can be used.

The submount 20 has a bottom face to which the base 10 is bonded, and has an upper face on which the semiconductor laser element 30 is disposed. The submount 20 has a function of securing an adequate height from the upper face of the base 10 to the light emission point at which the semiconductor laser element 30 emits light. Accordingly, the submount 20 can be omitted if the semiconductor laser element 30 can secure an adequate height on its own. By using a submount 20 formed of a material having higher thermal conductivity than that of the base 10, the submount 20 has a function of improving heat dissipation in addition to securing the height. In the light emitting device 1, the semiconductor laser element 30 has the light emission point on the lateral face that is closer to the light reflecting member 40, and light is emitted from the light emission point towards the light reflecting member 40.

In the present disclosure, the adequate height to be secured can be defined, for example, as a height which does not allow the main portion of the emitted light from the semiconductor laser element 30 to directly irradiate the base 10. Using the component-disposing face of the base 10 as a reference, the emitted light from the semiconductor laser element 30 can be segmented into the light travelling towards the component-disposing face, the light travelling in parallel to the component-disposing face, and the light travelling away from the component-disposing face. Accordingly, in this example, the height is secured so that the portion of the main portion of the light that travels towards the component-disposing face does not directly irradiate the component-disposing face, but instead irradiates the light reflecting member 40. For this purpose, the height to be secured is determined by taking into consideration the spread of the emitted light from the semiconductor laser element 30, the distance between the semiconductor laser element 30 and the light reflecting member 40 disposed on the component-disposing face, and the like. In the present disclosure, the main portion of the light from a laser element refers to the portion having an intensity in the range of from the laser beam's peak intensity value to a given intensity, such as $1/e^2$.

For the submount 20, one that suitably adheres the base 10 to the semiconductor laser element 30 is preferable. In the case of using a material containing nitride semiconductors for the semiconductor laser element 30 and an aluminum nitride as a base material for the base 10, for example, an aluminum nitride or silicon carbide can be used for the submount 20. A metal film is disposed on the submount 20, and the semiconductor laser element 30 is secured to the submount 20 using a conductive layer such as Au—Sn.

The bottom face of the semiconductor laser element 30 is bonded to the submount 20, and the semiconductor laser element emits light from the lateral face that is closer to the light reflecting member 40. The emitted light from the semiconductor laser element 30 has an elliptical far field pattern (hereinafter referred to as "FFP") where the length in the stacking direction of multiple semiconductor layers, including an active layer, is larger than the length in the direction perpendicular to the stacking direction in a plane parallel to the light emitting end face. An FFP in the present disclosure is a luminous intensity distribution of the emitted light measured at a plane that is at a certain distance from and in parallel to the light emitting end face of the semiconductor laser element. The shape of an FFP is identified as the shape of the main portion of light.

The bottom face of the light reflecting member 40 is bonded to the base 10, and the light reflecting member 40 reflects the emitted light from the semiconductor laser element 30. The light reflected by the light reflecting member 40 travels towards the lens member 50 located upwards thereof. The optical path length of the emitted light from the semiconductor laser element 30 to the lens member 50 tends to be larger when the light travels by way of the light reflecting member 40 than in the case of not by way of the light reflecting member 40. A longer optical path length can reduce the impact of a misalignment between the light reflecting member 40 and the semiconductor laser element 30.

The light reflecting member 40 has a light reflecting face on at least one face. The light reflecting member 40 receives the light from the semiconductor laser element 30 thus it is preferable to use a highly heat resistant material as a main material for the light reflecting member, and a material having high reflectance for the light reflecting face. The base material of the light reflecting member 40 may be formed of a glass material such as quartz, BK7 (borosilicate glass), a metal such as aluminum, or Si or the like. The reflecting face of the light reflecting member 40 may be formed of a metal or dielectric multilayer. The light emitting device 1 may include a light reflecting member 40 having multiple light reflecting faces or another light reflecting member in addition to the light reflecting member 40, as needed.

The lens member 50 is disposed in the position where the emitted light from the semiconductor laser element 30 enters. The light entering the lens member 50 includes the light entering after being reflected by the light reflecting member 40, and the light entering after travelling upwards of the light reflecting member 40 without being reflected by the light reflecting member 40. To simplify the description, the light entering after being reflected by the light reflecting member 40 will be hereinafter referred to as "reflected light", and the light entering after travelling above the light reflecting member 40 without being reflected by the light reflecting member 40 will be referred to as "non-reflected light". For the lens member 50, for example, a glass material such as BK7 and B270 can be used.

Figure 2:
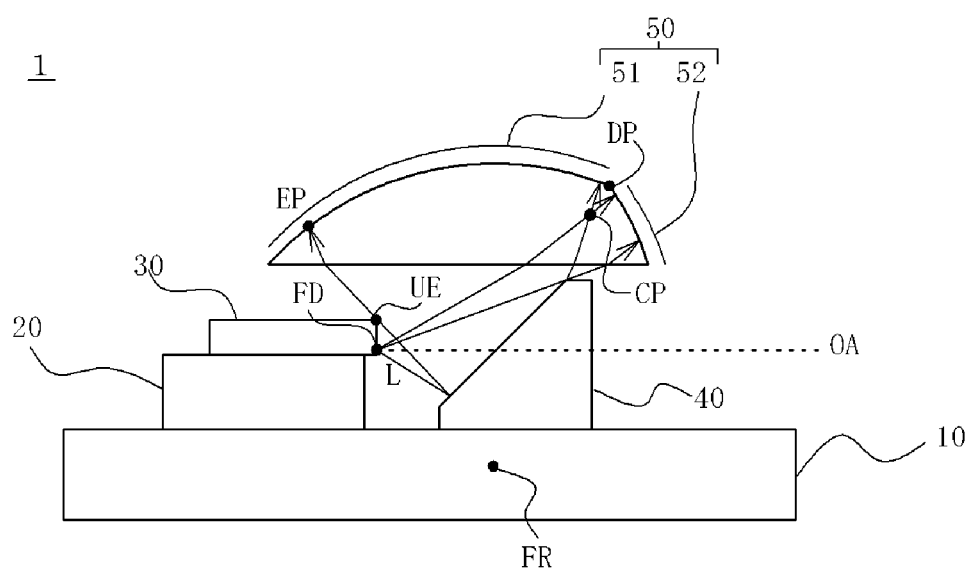
FIG. 2 is a schematic diagram illustrating the structure of the lens member of the light emitting device.
Figure 3:
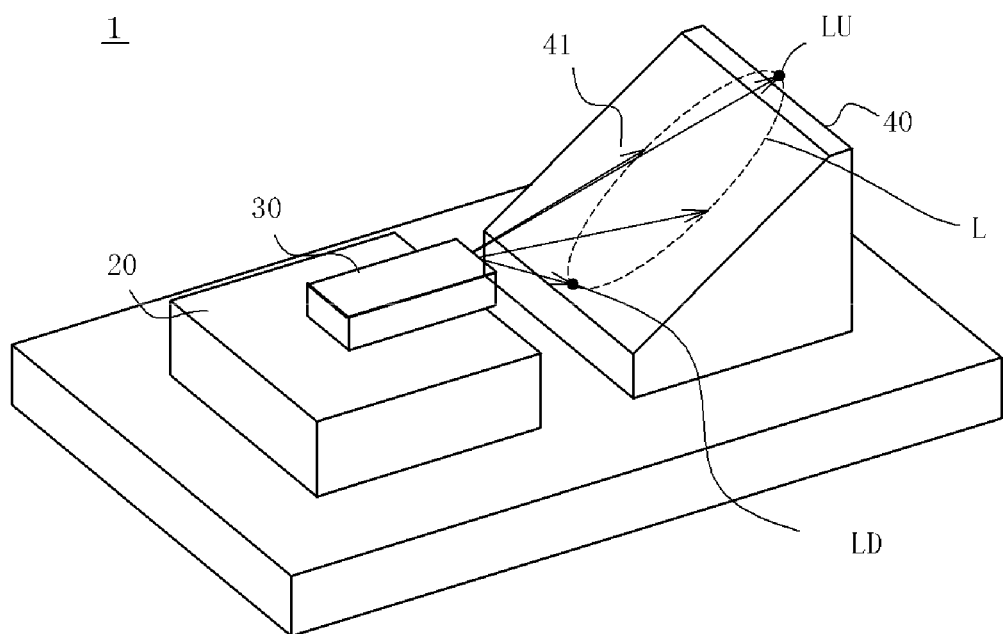
FIG. 3 is a perspective view of the light emitting device without showing the lens member.

FIG. 2 is a schematic diagram explaining the structure of the lens member in the light emitting device 1 according to the first embodiment of the present disclosure. FIG. 3 is a perspective view of the light emitting device 1 to illustrate the emitted light from the semiconductor laser element 30 according to the first embodiment. The lens member 50 is not shown in FIG. 3 for clarity of explanation.

As shown in FIG. 2, the lens member 50 of the light emitting device 1 includes a reflected light passing region having a first lens shape 51 and a non-reflected light passing region having a second lens shape 52. The first lens shape 51 has a lens shape designed to control the portion of the emitted light from the semiconductor laser element 30 that is reflected light. On the other hand, the second lens shape 52 has a lens shape designed to control the non-reflected light. Specifically, in the light emitting device 1 according to the first embodiment, the lens shape of the first lens shape 51 is designed based on the focal point FR of the reflected light and the lens shape of the second lens shape 52 is designed based on the focal point FD of the non-reflected light. The optical controls using the lens member 50 include, for example, collecting, dispersing, and collimating light.

The solid arrowed lines in FIG. 2 and FIG. 3 indicate the travelling directions of the light L emitted from the semiconductor laser element 30. The broken line in FIG. 3 indicates the irradiation region where the main portion of the emitted light from the semiconductor laser element 30 irradiates the plane where the light reflecting face 41 of the light reflecting member 40 is present.

The semiconductor laser element 30 emits light having an elliptical FFP. The beam divergence is larger in the vertical direction than the lateral direction. The irradiation region has the shape attributable to this. As shown in FIG. 3, in the light emitting device 1, a portion of the irradiation region is not contained in the light reflecting face 41 of the light reflecting member 40. This portion of light does not irradiate the light reflecting face 41, but passes upwards of that. The portion of the emitted light from the semiconductor laser element 30 that irradiates and is reflected by the light reflecting face 41 constitutes reflected light, and the light that does not irradiate the light reflecting face 41 and travels upwards of the light reflecting face 41 constitutes non-reflected light.

Among the points LU and LD located at two opposing ends of the vertical beam spread, the point LD is preferably present in the light reflecting face 41. Specifically, a lower end of a vertical divergence of the main portion of the emitted light from the semiconductor laser element 30 is present in the light reflecting face 41 of the light reflecting member 40. In this case, the portion of the light travelling towards the edge of the vertical beam spread that travels away from the component-disposing face of the base 10 is non-reflected light passing outside the light reflecting member 40, and that travelling towards the component-disposing face of the base 10 is reflected light which irradiates and is reflected by the light reflecting face 41. The upper edge of the light reflecting face 41 can be understood as the boundary between reflected light and non-reflected light. In other word, the light reflecting member 40 is positioned with respect to the semiconductor laser element 30 so that emitted light from the semiconductor laser element 30 is divided into a portion of the emitted light from the semiconductor laser element 30 irradiating onto the light reflecting face 41 and a portion of the emitted light from the semiconductor laser element 30 traveling outside of the light reflecting face 41 by having the edge of the light reflecting face 41 serve as the boundary.

As shown in FIG. 2, the first lens shape 51 is for controlling the output direction of the reflected light travelling upwards by way of the light reflecting member 40, thus it is designed so that the light reflected at the boundary passes through the first lens shape 51 before externally output from the lens member 50. The first lens shape 51 is also designed so that the main portion of the light reflected at a location close to the lower edge of the light reflecting face 41 also passes through the first lens shape 51 before externally output from the lens member 50.

In the case where the light irradiating the point LD (in FIG. 3) and reflected irradiates the semiconductor laser element 30 or the submount 20 and not entering the lens member 50, the light reflected at a position near the lower edge of the light reflecting face 41 includes light that does not enter the lens member 50. The materials composing and the size of the semiconductor laser element 30, the laser beam divergence angle, the angle of the light reflecting face 41 of the light reflecting member 40, and the like affect whether the main portion of the light includes such light.

If the light reflected at the point LD enters the lens member, the lens member 50 can simply be designed so that the light reflected at the point LD passes through the first lens shape. If not, on the other hand, the first lens shape 51 can simply be provided on the extension of the travelling direction of the portion of the light reflected near the lower edge of the light reflecting member 41 that travels towards the upper edge UE of the semiconductor laser element 30 as shown in FIG. 2. The upper edge UE is a boundary between the reflected light directly travelling toward the incident face of the lens member 50 and the reflected light being incident on other member. The aforementioned "other member" refers the member(s) positioned between the component-disposing face of the base 10 and the incident face of the lens member 50.

The second lens shape 52 can conceivably be designed so that the portion of the emitted light from the semiconductor laser element 30 that is emitted most upwards passes through the second lens shape 52 before being externally output from the lens member 50. The lens member 50 may be designed so that the straight line connecting the light emission point FD of the semiconductor laser element 30 and the upper edge boundary of the light reflecting face 41 passes through the second lens shape 52. Thus, the light travelling outside the light reflecting face 41, in other words, the entire non-reflected light passing upwards of the boundary of the light reflecting face 41 can be output from the second lens shape 52 in FIG. 2.

The boundary between the first lens shape 51 and the second lens shape 52 is located at the intersection point CP of the upper most light path of the non-reflected light and the path of light reflected at the boundary of the light reflecting face 41. This can avoid the situation where the reflected light passes through the second lens shape 52 and the non-reflected light passes through the first lens shape 51. Considering the manufacturing tolerance of the light emitting device 1, however, it is desirable to set the boundary DP between the first lens shape 51 and the second lens shape 52 at a position farther from the intersection point CP as shown in FIG. 2. Specifically, the boundary DP may be set at a position that is farther from the intersection point CP using the focal point FD or FR as a reference in the region interposed between the upper most part of the light path from the semiconductor laser element 50 and the path of light reflected at the boundary of the light reflecting face 41 which is the region where, theoretically, neither reflected light nor non-reflected light passes through.

On the other hand, setting the DP in this manner increases the vertical beam divergence, resulting in increase of the size of the light emitting device 1. This is because the intersection point CP will be positioned more upwards, which proportionally positions the DP more upwards to thereby increase the height of the light emitting device 1 as a whole. Accordingly, in order to reduce the size of the light emitting device 1, the boundary DP may be positioned at a closer position than the CP. Such a case gives rise to a region where both reflected light and non-reflected light are output from the spherical surface of the lens member 50. In this case, it is preferable to make this region the first lens shape 51 by prioritizing the reflected light. Because the intensity of reflected light is higher, prioritizing the reflected light increases the total amount of light that is controlled and output. At any rate, the lens member 50 is preferably designed by taking into consideration the manufacturing tolerance so that the light reflected at the upper edge of the light reflecting face 41 passes through the first lens shape 51, and is preferably designed so that the entire reflected light in the main portion of the light passes through the first lens shape 51.

In FIG. 2, the device is designed so that the travelling direction OA which is the direction of the portion of the emitted light from the semiconductor laser element 30 that travels perpendicularly to the emission end face is in parallel to the bonding face between the base 10 and the light reflecting member 40, but this being in parallel is not necessarily required. The present disclosure is applicable to a light emitting device requiring or not requiring the direction being in parallel.

Figure 4A:
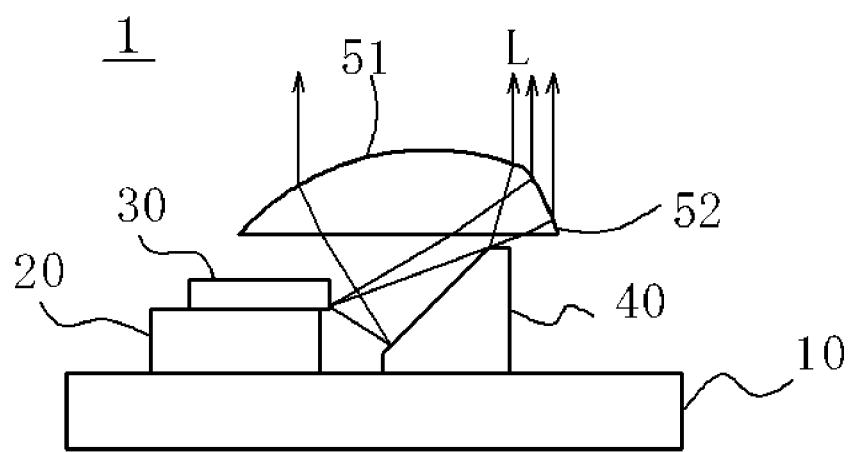
FIG. 4A shows an example of an optical control method based on the lens member.

FIGS. 4A to 4D show examples of how the lens member 50 controls light. FIG. 4A shows an optical control such that both reflected light and non-reflected light are collimated in the same direction. In this case, the first lens shape 51 and the second lens shape 52 have the shapes to function as collimating lenses for collimating reflected light and non-reflected light, respectively. The first lens shape 51 is designed so as to collimate the light from the focal point FR to a given direction, and the second lens shape 52 is designed so as to collimate the light from the focal point FD into the same direction as that being controlled by the first lens shape 51. In this manner, in the case where a portion of the emitted light from the semiconductor laser element 30 is non-reflected light, for example, the device can output collimated light having a larger amount of light than in the case of only utilizing reflected light.

Figure 4B:
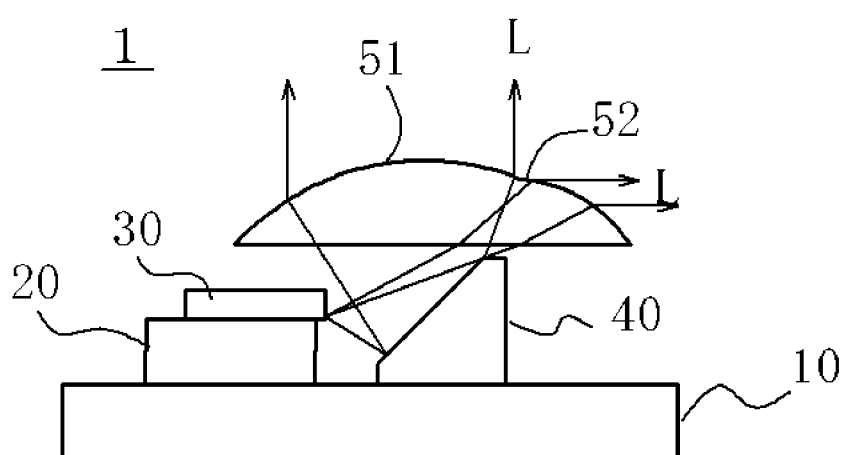
FIG. 4B shows another example of an optical control method based on the lens member.

FIG. 4B shows a case where reflected light and non-reflected light are collimated in different directions. Accordingly, the first lens shape 51 and the second lens shape 52 are designed so that the light will respectively be collimated in given directions using as reference the focal points FR and FD. In this manner, for example, by adjusting the percentages of reflected light and non-reflected light, the emitted light from a single semiconductor laser element 30 can be separated into two to be each utilized as collimated light. Moreover, for example, the travelling direction of non-reflected light can be controlled so as not to interfere with the irradiation region of the collimated reflected light.

Figure 4C:
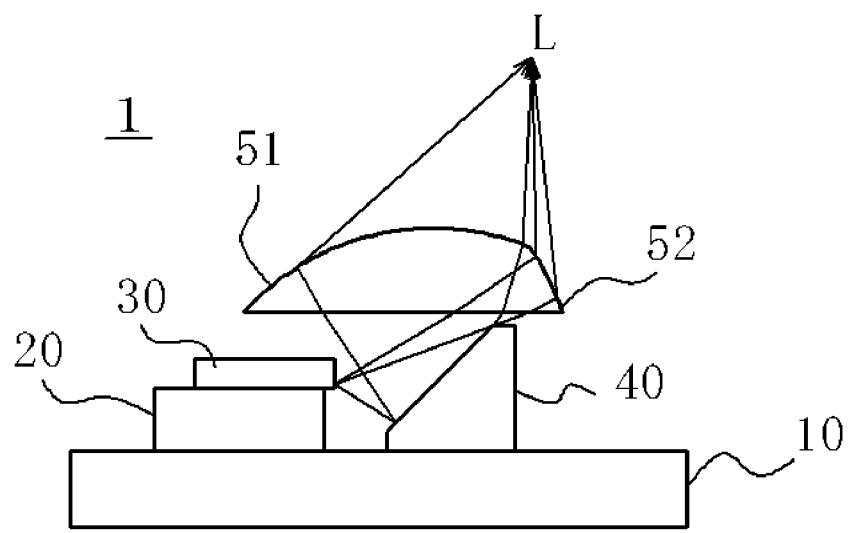
FIG. 4C shows another example of an optical control method based on the lens member.

FIG. 4C shows an optical control where reflected light and non-reflected light are collected to the same point. In this case, the first lens shape 51 and the second lens shape 52 are designed so that reflected light and non-reflected light are collected at the same point. In this manner, in the case where a portion of the emitted light from the semiconductor laser element 30 is non-reflected light, for example, a larger amount of light can be collected than in the case of utilizing only reflected light.

Figure 4D:
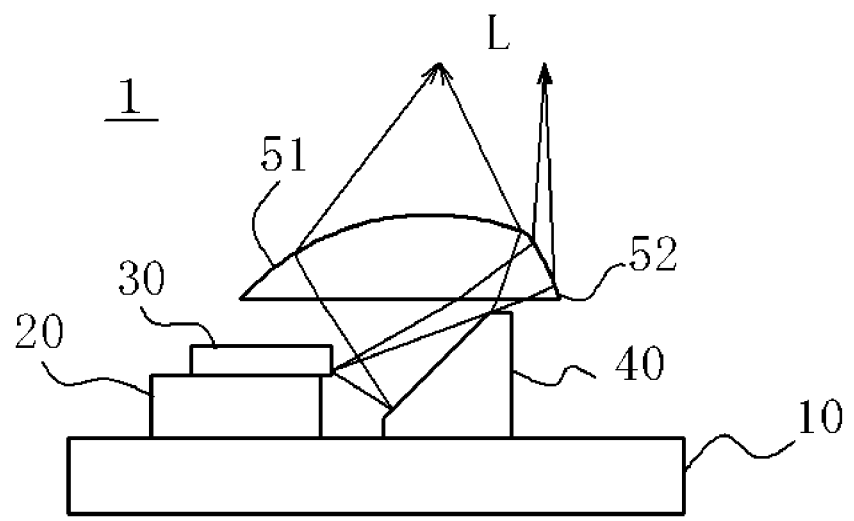
FIG. 4D shows another example of an optical control method based on the lens member.

FIG. 4D shows an optical control that collects reflected light and non-reflected light at different points, and the first lens shape 51 and the second lens shape 52 are designed in accordance with the points at which each light is collected. In this manner, for example, by adjusting the percentages of reflected light and non-reflected light, the emitted light from a single semiconductor laser element 30 can be separated into two to be each collected at a specific position. The light control may be performed other methods without any limitation to those that have been described above. The shapes of the first lens shape 51 and the second lens shape 52 can simply be designed in accordance with a desired manner in which reflected light and non-reflected light are to be controlled.

As explained above, the light emitting device 1 according to the first embodiment can achieve light output controls tailored to both portions of the emitted light from the semiconductor laser element 30 that are reflected light and non-reflected light.

Second Embodiment

Figure 5:
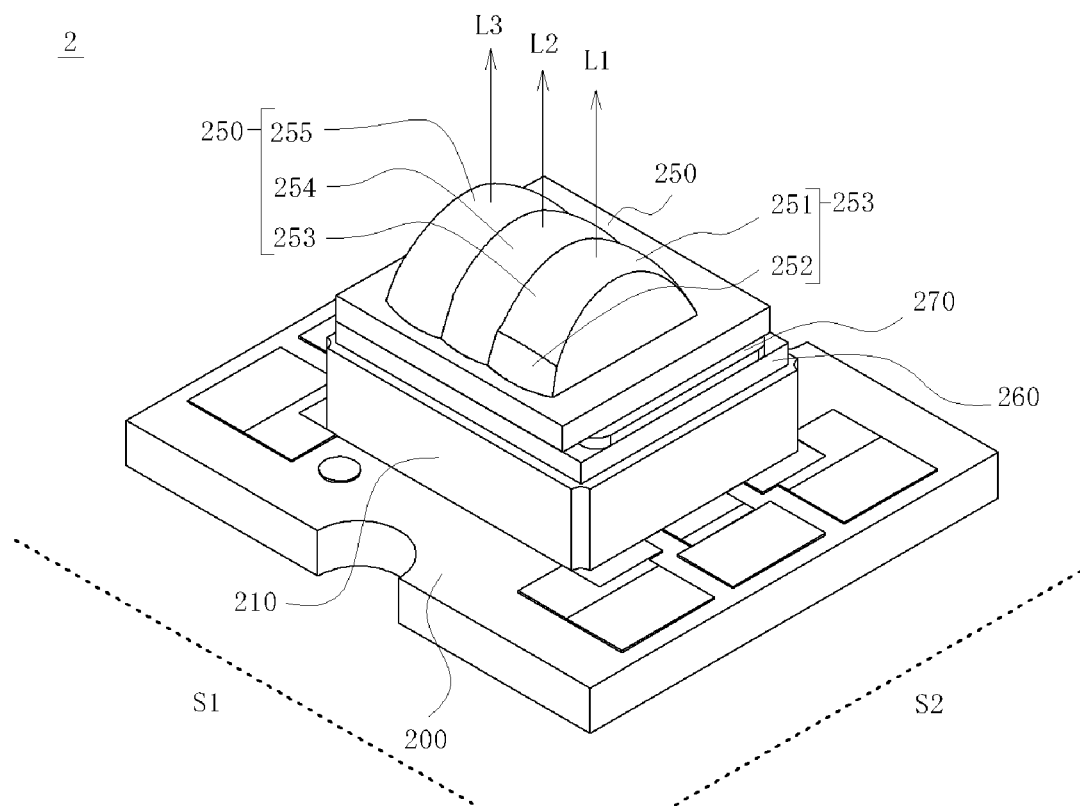
FIG. 5 is a perspective view of a light emitting device according to a second embodiment.
Figure 6:
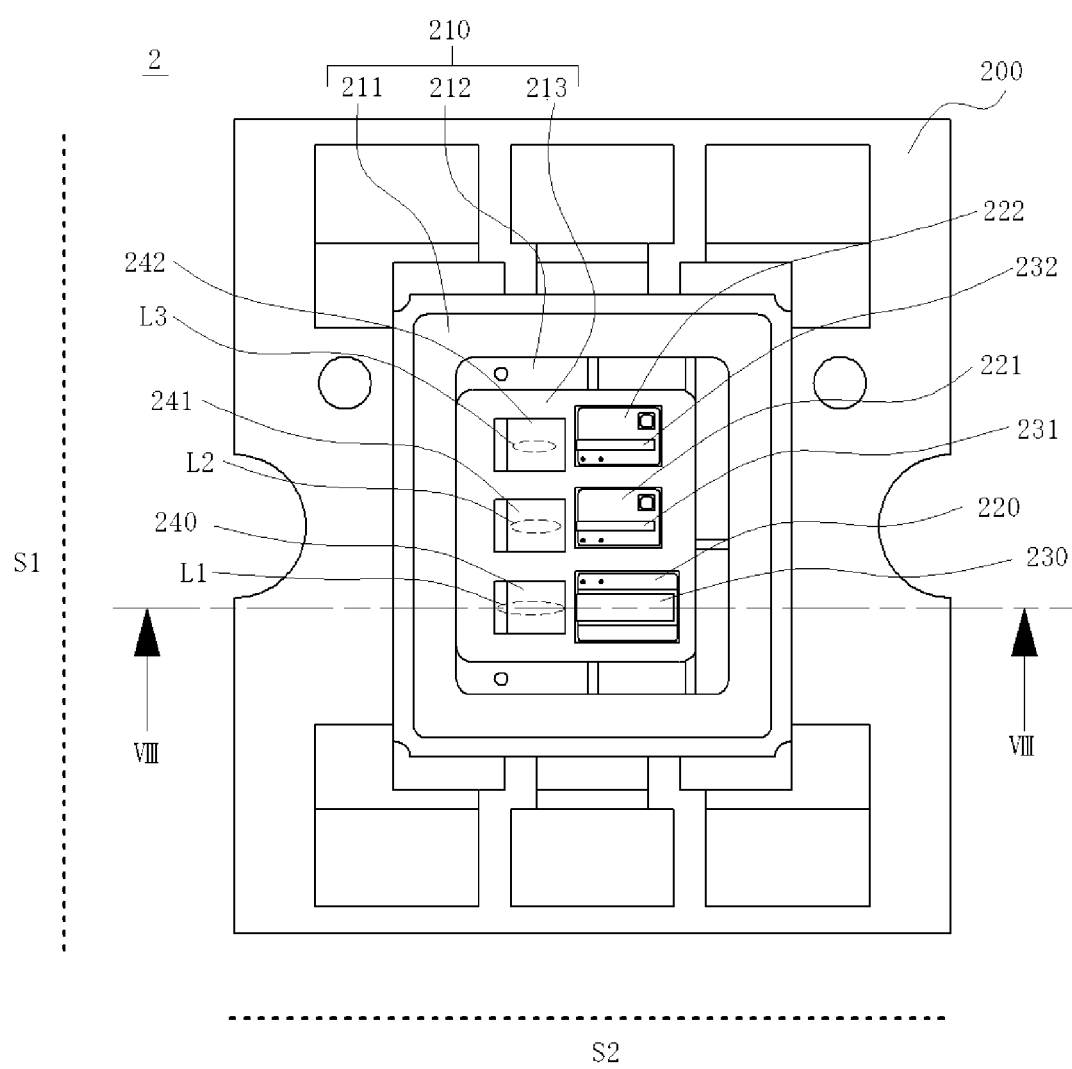
FIG. 6 is a top view illustrating how the semiconductor laser elements, etc., are arranged in the light emitting device according to the second embodiment while omitting some elements.
Figure 7:
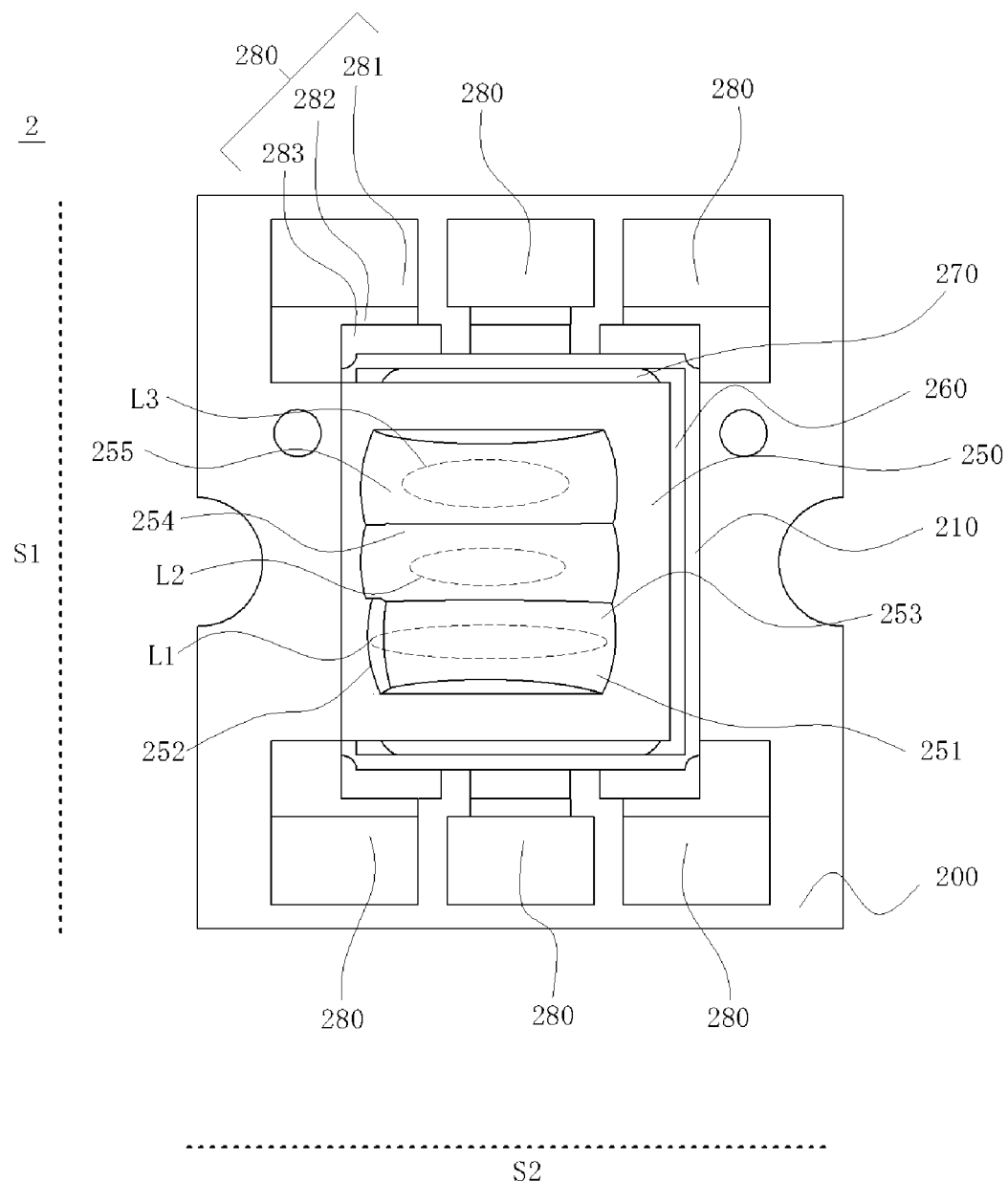
FIG. 7 is a top view of the light emitting device according to the second embodiment.
Figure 8:
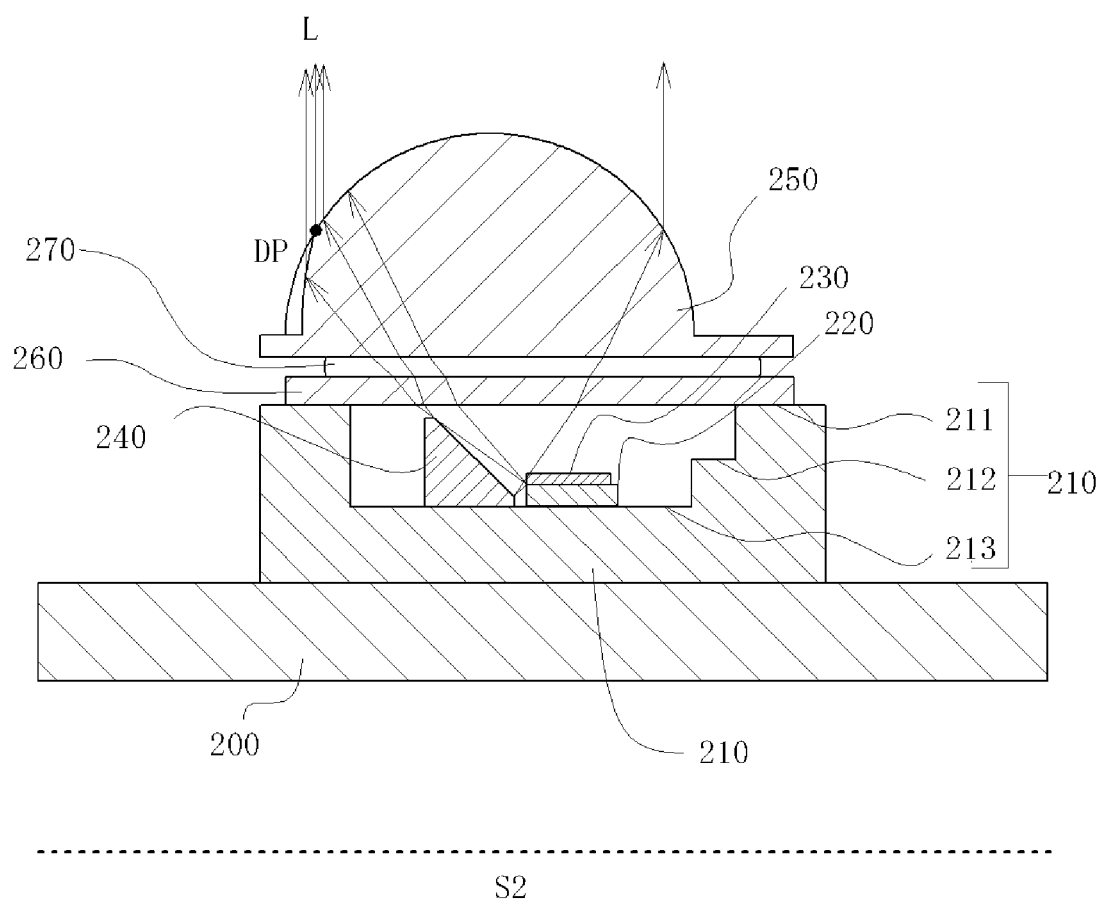
FIG. 8 is a cross-sectional view of the light emitting device according to the second embodiment taken along a straight line VIII-VIII in FIG. 6.

A light emitting device 2 according to a second embodiment externally outputs the emitted light from multiple semiconductor laser elements through the lens member. The light emitting device 2 according to the second embodiment, moreover, has a package having the function of outputting controlled light, and a mounting substrate. The mounting substrate does not have to be included. FIG. 5 to FIG. 8 are diagrams illustrating the light emitting device 2. FIG. 5 is a perspective view of the light emitting device 2. FIG. 6 is a top view showing the constituent elements arranged in the frame of the base 210 of the light emitting device 2. FIG. 7 is a top view of the light emitting device 2. FIG. 8 is a cross-sectional view of the light emitting device taken along line VIII-VIII in FIG. 7. For clarity of explanation, FIG. 6 shows the state where the cover 260 bonded to the base 210 is omitted from the light emitting device 2. In FIG. 5 to FIG. 8, dotted lines S1 and S2 are supplemental lines to indicate how the orientation of the light emitting device 2 correspond among the drawings, and are not constituent elements of the light emitting device 2.

As shown in FIG. 5, the light emitting device 2 has a substrate 200 serving as a mounting substrate, a base 210 serving as a package, a cover 260, a bonding part 270, and a lens member 250. The base 210 has a recessed shape as a whole, and as shown in FIG. 6, multiple semiconductor laser elements, submounts respectively corresponding to the semiconductor laser elements, and multiple light reflecting members are arranged in the framed area surrounded by the lateral portions of the base 210.

Specifically, on the planar face in the frame of the base 210, a first semiconductor laser element 230, a second semiconductor laser element 231, a third semiconductor laser element 232, a first submount 220 on which the first semiconductor laser element 230 is disposed, a second submount 221 on which the second semiconductor laser element 231 is disposed, a third submount 222 on which the third semiconductor laser element 232 is disposed, a first light reflecting member 240 corresponding to the first semiconductor laser element 230, a second light reflecting member 241 corresponding to the second semiconductor laser element 231, and a third light reflecting member 242 corresponding to the third semiconductor laser element 232 are disposed. The constituent elements of the light emitting device 2 will be explained below.

The substrate 200 is bonded to the base 210 and has a function of electrically connecting the semiconductor laser elements disposed on the planar face of the base 210. The multiple metal films 280 shown in FIG. 7 are for that purpose. On the upper face of the substrate 200, three pairs of metal film 280 are disposed respectively corresponding to the semiconductor laser elements. Each metal film 280 has an insulating film-covered region 282, while regions 281 and 283 of the metal film are not covered. The insulating film 282 can reduce the spreading of solder onto the metal film region 281 when the base 210 is soldered to the substrate 200. The substrate 200 can be formed using a combination of an insulating material, such as a ceramic, and a conductive material, such as a metal.

The base 210, as shown in FIG. 8, has a bottom part and lateral parts, and the recess is defined by the upper face 213 of the bottom part and the inner lateral faces of the lateral parts. The outer lateral faces of the lateral parts meet the lower face of the bottom part, and the bottom faces of the lateral parts are also configured as parts of the lower face of the bottom part. The upper faces 211 of the lateral parts of the base 210 are bonded to the cover 260, and the lower face of the bottom part is bonded to the substrate 200. As shown in FIG. 6, multiple light reflecting members and the submounts respectively corresponding to the semiconductor laser elements are directly disposed on the upper face 213 of the bottom part. Similar to the first embodiment, the submounts may be omitted where the semiconductor laser elements are disposed directly on the upper face of the bottom part. The lower face of the bottom part can be considered as the bonding face with the substrate 200. The upper face of the bottom part can be considered as the surface on which the semiconductor laser elements, light reflecting members, and/or submounts are disposed. The upper faces of the lateral parts can be considered as the bonding faces with the cover 260.

As shown in FIGS. 6 and 8, the base 210 has one or more stepped portions inside the recess at some of the lateral parts. In the example shown in FIG. 6, the one or more stepped portions are provided on the inner sides of the lateral parts excluding one on the S1 side. A metal film for electrically connecting with the substrate 200 is formed on the planar faces 212 formed by the stepped portions, in other words, the planar faces 212 formed between the inner lateral faces meeting the upper face 213 of the bottom part of the base 210 and the inner lateral faces of the lateral parts meeting the upper faces 211 of the lateral parts of the base 210. Each semiconductor laser element can receive the supply of power from the outside of the light emitting device 2 by electrically connecting the metal film using wires.

The cover 260 is bonded to the base 210 to thereby cover the framed area surrounded by the lateral parts of the base 210. A metal film is disposed in the area of the lower face of the cover 260 to be bonded to the base 210, and the base 210 and the cover 260 are bonded and fixed via AuSn or the like. The closed space formed by bonding the base 210 and the cover 260 together is a sealed space. Disposing semiconductor laser elements in this closed space can reduce dust, such as organic substances and like, from adhering to the emission end faces of the semiconductor laser elements. For the cover 260, glass with a metal film disposed thereon, or sapphire with a metal film disposed thereon can be used, for example. Among them, sapphire with a metal film disposed thereon is preferable. When light spreads, the shape of a lens part through which the light passes is needed to increases in size. Sapphire which has a relatively high refractive index can reduce the spreading of light, thereby maintaining the size of the lens part of the lens member 250 under control. Moreover, because sapphire has relatively high strength and is not susceptible to damage, the reliability of the hermetic seal can be ensured for the closed space.

The bonding part 270 is formed by the adhesive that bonds the cover 260 and the lens member 250. The bonding part 270 adheres to the upper face of the cover 260 and the lower face of the lens member 250 thereby fixing the cover 260 and the lens member 250. The bonding part 270 is not formed across the entire upper face of the cover 260 or the entire lower face of the lens member 250, and is disposed so as not to interfere with the paths of light emitted from the semiconductor laser elements. For this purpose, the bonding member 270 is preferably formed by not forming it in the areas of the lower face of the lens member 250 that correspond to the regions where the first lens part 253, the second lens part 254, and the third lens part 255 are formed, but instead by forming it in the outer peripheral region of the lens member 250. For the adhesive that forms the bonding part 270, a UV curable resin is preferably used. A UV curable resin may be cured in a relatively short period of time without involving heat, thus it can readily secure the lens member 250 at a desired position.

The lens member 250 has a lens shape where multiple lens parts are linked. Specifically, a first lens part 253, a second lens part 254, and a third lens part 255 are linked, lens parts allowing light from semiconductor laser elements to respectively pass through. The first lens part 253 has a first lens shape 251 and a second lens shape 252. The first lens shape 251 (the reflected light passing region) and the second lens shape 252 (the non-reflected light passing region) of the first lens part 253 are linked to the first lens shape 251 (the reflected light passing region) of the second lens part 254. The first lens shape 251 and the second lens shape 252 are the same as or similar to the first lens shape 51 and the second lens shape 52 explained with reference to the first embodiment.

The light emitting device 2 according to the second embodiment includes three semiconductor laser elements where red light L1 emitted by the first semiconductor laser element 230 passes through the first lens part 253, blue light L2 emitted by the second semiconductor laser element 231 passes through the second lens part 254, and green light L3 emitted by the third semiconductor laser element 232 passes through the third lens part 255. The first lens shape 251 of the first lens part 253 is designed to collimate reflected red light, and the second lens shape 252 of the first lens part 253 is designed to collimate non-reflected red light. The second lens part 254 is designed to have a lens shape to collimate reflected blue light, and the third lens part 255 is designed to have a lens shape to collimate reflected green light.

The peak emission wavelength of blue light is preferably in the range of from 420 nm to 494 nm, more preferably in the range of from 440 nm to 475 nm. Examples of blue light emitting semiconductor laser elements include semiconductor laser elements which include nitride semiconductors. Examples of nitride semiconductors include GaN, InGaN, or AlGaN.

The peak emission wavelength of green light is preferably in the range of from 495 nm to 570 nm, more preferably in the range of from 510 nm to 550 nm. Examples of green light emitting semiconductor laser elements include semiconductor laser elements which include nitride semiconductors. Examples of nitride semiconductors include GaN, InGaN, or AlGaN.

The peak emission wavelength of red light is preferably in the range of from 605 nm to 750 nm, more preferably in the range of from 610 nm to 700 nm. Examples of red light emitting semiconductor laser elements include those including an InAlGaP-based, GaInP-based, GaAs-based, or AlGaAs-based semiconductor. In the present embodiment, a red light emitting semiconductor laser element equipped with two or more waveguide regions is used. Semiconductor laser elements including these semiconductors is likely to reduce output due to heat as compared to semiconductor laser elements including nitride semiconductors. Accordingly, increasing the waveguide regions can disperse heat thereby attenuating the output decline in the semiconductor laser element.

The light emitting device 2 can have a different color combination besides employing semiconductor laser elements in three colors of red, blue, and green. As described above, red light has inferior output characteristics attributable to heat as compared to others, and blue light generates less heat than green light. The green light emitting semiconductor laser element 231 among the three semiconductor laser elements is positioned in the middle of the light emitting device 2 because the semiconductor laser element 231 has the best thermal characteristics among these three. In other words, even in the case of employing semiconductor laser elements other than red, blue and green, it is preferable to dispose the semiconductor laser element having the best thermal characteristics among three in the middle.

A light reflecting member is provided per semiconductor laser element. A first light reflecting member 240 corresponding to the first semiconductor laser element 230, a second light reflecting member 241 corresponding to the second semiconductor laser element 231, and a third light reflecting member 242 corresponding to the third semiconductor laser element 232 are disposed on the planar face of the base 210.

In the frame of the base 210, the first semiconductor laser element 230, the second semiconductor laser element 231, and the third semiconductor laser element 232 are disposed so that the emission end faces of the three semiconductor laser elements are aligned. That is, the three semiconductor laser elements are disposed so that their emission end faces lie in a common plane.

Furthermore, the light reflecting members respectively corresponding to the three semiconductor laser elements are disposed so that the distances from the emission end faces of the corresponding semiconductor laser elements are equal. In the example shown in FIG. 6, the emission end faces of the three semiconductor laser elements are aligned, and the light reflecting faces of the three light reflecting members are also aligned. Moreover, the emission end faces are in parallel to the sides of the light reflecting faces on the semiconductor laser element side.

Furthermore, the light reflecting face each light reflecting members defines the same angle with the upper face of the bottom part of the base 210. In the example shown in FIG. 6, each light reflecting member is designed to define a 45 degree angle between the bottom face and the light reflecting face, and thus the angle defined with the upper face of the bottom part of the base 210 is also substantially 45 degrees. The light travelling in the direction perpendicular to the emission end faces will be reflected by the light reflecting faces of the light reflecting members, and travel upwards in the direction perpendicular to the upper face of the bottom part of the base 210.

The three semiconductor laser elements emit ellipse-shaped lights, and the emitted light travelling perpendicular to the emission end faces travels parallel to the planar face of the base 210 on which the light reflecting members are disposed. In addition, the emission positions are aligned to be at the same height from the surface of the base 210, thus the positions where the lights travelling perpendicular to the emission end faces irradiates the light reflecting faces are aligned.

If the elliptical shapes of the emitted lights match, the lights emitted from three semiconductor laser elements would irradiate the corresponding light reflecting members in the same or a similar manner, and would pass through the lens parts and be output in the same or a similar manner. In contrast, in the semiconductor light emitting device 2 according to the second embodiment, the emitted lights respectively emitted from the three semiconductor laser elements have different elliptical shapes. For example, the semiconductor laser element 230 has a larger elliptical irradiation region than those of the semiconductor laser elements 231 and 232. In FIG. 6, similar to FIG. 3, the irradiation regions of the emitted lights from the semiconductor laser elements are indicated as L1, L2, and L3. In the second embodiment, only the light emitted from the semiconductor laser element 230 has the irradiation region beyond the light reflecting face of the corresponding light reflecting member.

The light emitting device 2 according to the second embodiment is designed to have substantially the same emission end faces of the semiconductor laser elements, shapes, sizes or angles of the light reflecting faces of the light reflecting members, and the like among the three semiconductor laser elements or three light reflecting members, but the present disclosure is applicable to other designs. For example, a certain semiconductor laser element may be positioned farther from the light reflecting member, a certain light reflecting member may have a larger light reflecting face, and the angle of the light reflecting face may be adjusted for each semiconductor laser element. However, for example, positioning a certain semiconductor laser element farther from the light reflecting member possibly affects the size of the framed space to be secured, which might affect the size of the lateral parts of the base 210. Increasing the size of a light reflecting face possibly increase the height of the light reflecting member, which might affect the height of the lateral faces of the base 210. In other words, depending on how the semiconductor laser elements, the submounts, and the light reflecting members are arranged, the size of the light emitting device might become larger than that of the light emitting device 2. Moreover, if a certain semiconductor laser element is positioned farther from the light reflecting member, the light travelling towards the component-disposing face might not irradiate the light reflecting face. This is because the light travelling towards the component-disposing face advances downwards as the distance to the light reflecting face increases. All three semiconductor laser elements may be disposed on a single submount. Also, a single light reflecting member with one or more light reflecting faces may be provided which reflects light emitted from three semiconductor laser elements.

In FIG. 7, the broken lines L1, L2, and L3 show the passing regions where the main portions of the emitted light from the first semiconductor laser element 230, the second semiconductor laser element 231, and the third semiconductor laser element 232 pass through the lens member 250 before being output.

As shown by the broken lines L1 to L3, the passing region of the main portion of the light emitted from one semiconductor laser element is contained in one lens part. Moreover, as shown by the broken line L1, the main portion of the light emitted from the first semiconductor laser element 230 has the light passing through the first lens shape 251 and the light passing through the second lens shape 252.

The lens shape of each lens part is designed in accordance with the characteristics of the light emitted from the corresponding semiconductor laser element, such as the wavelength and focal point. As shown in FIG. 6, in the light emitting device 2 according to the second embodiment, a portion of the main portion of the light emitted from the first semiconductor laser element 230 has non-reflected light not irradiating the light reflecting face of the first light reflecting member 240. On the other hand, the main portion of the emitted light from the second semiconductor laser element 231 is entirely reflected by the light reflecting face of the second light reflecting member 241, and the main portion of the emitted light from the third semiconductor laser element 232 is entirely reflected by the light reflecting face of the third light reflecting member 242.

Accordingly, the first to third lens parts each have a first lens shape (the reflected light passing region) to control the reflected light, in other words, the light emitted from the corresponding semiconductor laser elements that is reflected by the light reflecting faces of the corresponding light reflecting members. The first lens part 253 also has a second lens shape (the non-reflected light passing region) to control non-reflected light, in other words, the light emitted from the corresponding semiconductor laser element that does not irradiate the light reflecting face and travel outside the light reflecting face. The second lens part 254 and the third lens part 255 each has no second lens shape (the non-reflected light passing region) because the entire main portions of the light emitted from the corresponding semiconductor laser elements are reflected by the corresponding light reflecting faces. The second lens part 254 and/or the third lens part 255 may each have a second lens shape. Accordingly, the lens member 250 can apply the intended controls to at least the main portions of the light emitted from the first to the third semiconductor laser elements.

In the light emitting device 2 according to the second embodiment, the lens member 250 has a lens shape where multiple lens parts are linked, but the size of each lens part is preferably large enough to cover the region through which the light from the corresponding semiconductor laser element passes at the very least. In addition, semiconductor laser elements need to be arranged close together in order to reduce the size of the light emitting device 2, thus the lens member 250 is formed to a size in accordance with that. In the case where the lengths of the lens parts corresponding to the major diameters of the elliptical beams are larger than the distance between two adjacent semiconductor laser elements, the widths of the lens parts corresponding to the minor diameters of the elliptical beams need to be designed smaller than the lengths corresponding to the major diameters.

In the light emitting device 2 according to the second embodiment, the sum of the half value of the lens length of the first lens part 253 corresponding to the major diameter of the beam and the half value of the lens length of the second lens part 254 corresponding to the major diameter of the beam is larger than the distance between the first semiconductor laser element 230 and the second semiconductor laser element 231. Accordingly, each lens part is not semispherical, but has the linked structure shown in FIG. 7, and the widths of the lens parts corresponding to the minor diameters of the elliptical beams are smaller than the lengths of the lens parts corresponding to the major diameters of the beams.

FIG. 8 is a cross-sectional view of the light emitting device 2 taken along straight line VIII-VIII in FIG. 6. As shown in FIG. 8, the portion of the emitted light from the first semiconductor laser element 230 that is reflected by the light reflecting face of the first light reflecting member 240 passes through the cover 260 and the space between the lens member 250 and the cover 260 created by the bonding part 270 before entering the lens member 250. Then the light entering the lens member 250 passes through the first lens shape 251 of the first lens part 253 before exiting from the light emitting device 2. In the example shown in FIG. 8, the output light travels in the direction perpendicular to the substrate 200.

The portion of the emitted light from the first semiconductor laser element 230 that travels upwards of the light reflecting face of the first light reflecting member 240 without being reflected by the light reflecting face passes through the cover 260 and the space between the lens member 250 and the cover 260 created by the bonding member 270 before entering the lens member 250. Then the light entering the lens member 250 passes through the second lens shape 252 of the first lens part 253 before exiting from the light emitting device 2. As shown in FIG. 8, the output light also travels in the direction perpendicular to the substrate 200.

Accordingly, both reflected light and non-reflected light of the emitted light from the first semiconductor laser element 230 can be collimated in the same direction when externally output. Moreover, the lights emitted from the second semiconductor laser element 231 and the third semiconductor laser element 232 can also be collimated when exiting from the light emitting device 2 in the same direction as that of the light output from the first semiconductor laser element 230. A light emitting device can thus be provided where the red, green, and blue light output directions are controlled.

Even though the emitted light from the first semiconductor laser element 230 passes through another member such as the cover 260 before entering the lens member 250 by way of or not by way of the light reflecting face of the first light reflecting member 240, the light emitting device 2 is the same as the light emitting device 1 according to the first embodiment at the point that the first lens part 253 has the first lens shape designed to control reflected light and a second lens shape designed to control non-reflected light.

In the light emitting device 2 according to the second embodiment, the vertical beam divergence of at least one of the semiconductor laser elements is larger than the vertical beam divergence of the other semiconductor laser elements. If the light reflecting face of the light reflecting member is enlarged so that the entire emitted light from the semiconductor laser element having a large vertical beam divergence irradiates the light reflecting face, the height of the light reflecting member would increase, to thereby increase the size of the light emitting device 2.

In the light emitting device 2 according to the second embodiment, a light reflecting face large enough to reflect the entire emitted light from the semiconductor laser element having the smallest vertical beam divergence is secured, while allowing a portion of the emitted light from the semiconductor laser element having a larger vertical beam divergence does not irradiate the light reflecting face. Thus, a smaller light emitting device 2 can be achieved as compared to matching the size of the light reflecting face with the light having a large vertical beam divergence.

The light emitting device 2 according to the second embodiment has a lens part having a first lens shape and a second lens shape, and lens parts each having a first lens shape, but not a second lens shape. Moreover, the length of the major diameter of the lens part corresponding to the vertical beam spread is smaller in the case of the lens part having a second lens shape than in the case of the lens parts having no second lens shape. Thus, providing a second lens shape does not increase the size of the lens part.

Example 1

An example of the second light emitting device 2 described with reference to the second embodiment will be explained next. The light emitting device 2 of Example 1 has a substrate 200 that is about 10 mm per side where the S1 side is about a few mm larger than the S2 side. The length of the outer lateral faces of the base 210 is about 7.0 mm on the S1 side, and about 6.0 mm on the S2 side. The height from the lower face of the bottom part of the base 210 to the apex of the lens part of the lens member 250 is about 5.1 mm, and if the thickness of the substrate 200 is included, the height of the light emitting device 2 is about 6.0 mm.

The height of the base 210 from the lower face of its bottom part to the upper faces 211 of its lateral parts is about 2.0 mm, the height of the lens member 250 from its lower face to its apex is about 2.5 mm, and the height of a lens part from the bottom face to the apex is about 1.90 mm. The bottom face of the lens part refers to a planar face on which the lens part is placed, assuming the lens portion is configured with the lens shape and the planar face placed thereon. The height from the lower face of the lens member 250 to the bottom faces of the lens parts is about 0.6 mm.

The length of the side of the lens member 250 is about 6.0 mm on the S1 side and about 5.5 mm on the S2 side, the length of a lens part is about 5.0 mm in the S1 direction. The spacing between adjacent semiconductor laser elements is about 1.25 mm, the lengths of the first lens part 253, the second lens part 254, and the third lens part 255 corresponding to the vertical beam spread is respectively about 4.32 mm, about 4.48 mm, and about 4.46 mm. The length of the first lens shape assuming that there is no second lens shape is about 4.43 mm. The length of each lens part in the S1 direction is 1.87 mm for the first lens part 253, 1.25 mm for the second lens part 254, and 1.88 mm for the third lens part 255.

The length of the irradiation region corresponding to the major diameter of the elliptical beam which is the passing region in the first lens part 253 corresponding to the main portion of the emitted light from the red light emitting first semiconductor laser element 230 is about 4.0 mm. The length of the irradiation region corresponding to the major diameter of the elliptical beam which is the passing region in the second lens part 254 corresponding to the main portion of the emitted light from the green light emitting second semiconductor laser element 231 is 3.3 mm. The length of the irradiation region corresponding to the major diameter of the elliptical beam which is the passing region in the third lens part 255 corresponding to the main portion of the emitted light from the blue light emitting third semiconductor laser element 232 is about 3.3 mm. Similarly, the lengths of the irradiation regions corresponding to the minor diameters of the elliptical beams are respectively about 0.80 mm, about 0.65 mm, and about 0.80 mm.

As described above, in the light emitting device 2 of Example 1, the length of the irradiation region corresponding to the major diameter of the elliptical beam of each laser is larger than the distance between adjacent semiconductor laser elements. The lengths of the lens parts covering the irradiation regions are larger than the length of the irradiation regions, but if the lengths of the lens parts corresponding to the minor diameters of the beams are the same, the distances between the semiconductor laser elements must be increased accordingly. This will increase the sizes of the lateral parts of the base 210 which consequently increases the package size. In order to reduce the package size, it would be better to adjust the shapes of the lens parts in accordance with the spaces between the semiconductor laser elements and form the lens parts, rather than adjusting the spaces between the semiconductor laser elements in accordance with the lens diameters of the lens parts.

In the light emitting device 2 of Example 1, moreover, three semiconductor laser elements are disposed in the frame of the base 210 having the outer lateral faces which is about 7.0 mm in length on the S1 side and about 6.0 mm in length on the S2 side, and red, green, and blue beams are individually collimated before being externally output from the light emitting device. In measuring the optical characteristics of the beams in the three colors, such as the luminous intensity and peak wavelength, the main portions of the beams can separately be dispersed by using multiple dichroic mirrors. For example, the red collimated light emitted from the first lens part 253 is allowed to travel towards one dichroic mirror, and the green collimated light emitted from the second lens part 254 is allowed to travel towards another dichroic mirror. The beams in the three colors travel in different directions, thus the optical characteristics of the beams in three color lights emitted from the light emitting device 2 of Example 1 can be measured by providing a measuring device at each destination while allowing the device to simultaneously output beams in three colors. In this manner, the measurement can be efficiently performed more than a case where measuring while allowing it to emit one beam of a color at a time.

Light emitting devices according to the present disclosure have been described above based on embodiments and examples, but the light emitting devices embodying the technical ideas of the present disclosure are not required to these. For example, semiconductor laser elements are employed as light emitting elements, but other light emitting elements may be used instead. The first to third semiconductor laser elements described are examples of the first to third light emitting elements.

In a light emitting device according to the present disclosure, when the emitted light from a light emitting element travels towards a light reflecting member, the light irradiates the light reflecting face of a light reflecting member while having a shape with some extent of a width but not like a dot shape. In addition, a portion of the light passes without irradiating the light reflecting member. In such a situation, a light emitting device having the lens member according to the present disclosure can control both reflected light and non-reflected light.

Moreover, light emitting devices having the technical characteristics disclosed herein are not required to those having the structures of the light emitting device 1 or the light emitting device 2. For example, the present disclosure is applicable to a light emitting device having a constituent element not disclosed in the first or the second embodiment, and the fact that there is a difference from the disclosed light emitting devices would not form the grounds for negating the applicability of the present disclosure. Furthermore, a constituent element which is disclosed in the second embodiment, but not disclosed in the first embodiment, can be incorporated into a light emitting device according to the first embodiment.

This, in other words, indicates that the present disclosure is applicable to even a light emitting device which does not make it essential to necessarily and fully include all of the constituent elements of the light emitting device disclosed by the first embodiment or the second embodiment. For example, in the case where the claim scope does not disclose a certain element of the light emitting device described by the first embodiment or the second embodiment, such an element is not limited to that disclosed by the embodiment, and the present disclosure disclosed in the claim scope is still applicable when recognizing design flexibility for a person having ordinary skills in the art, such as employing an alternative, making an omission or a change in the shape or the materials for the constituent element.

The light emitting device disclosed in the embodiments can be used in projectors, automotive headlights, lighting fixtures, display backlights, and the like.

What is claimed is:

1. A light emitting device comprising:
a first light emitting element configured to emit light;
a second light emitting element configured to emit light, a vertical divergence of the emitted light from the first light emitting element being larger than a vertical divergence of the emitted light from the second light emitting element;
a first light reflecting member having a light reflecting face configured to reflect light, the first light reflecting member being positioned with respect to the first light emitting element so that emitted light from the first light emitting element is divided into a portion of the emitted light from the first light emitting element irradiating onto the light reflecting face and a portion of the emitted light from the first light emitting element traveling outside of the light reflecting face by having an edge of the light reflecting face serve as a boundary;
a second light reflecting member having a light reflecting face, the second light reflecting member being formed integrally with or separately from the first light reflecting member, and positioned with respect to the second light emitting element so that emitted light from the second light emitting element irradiates onto the light reflecting face of the second light reflecting member; and
a lens member having a first lens part and a second lens part, the first lens part being configured to control a travelling direction of the emitted light from the first light emitting element, the second lens part being configured to control a travelling direction of the emitted light from the second light emitting element, the lens member including
a reflected light passing region having a first lens shape in the first lens part and the second lens part, the reflected light passing region being configured to control the travelling direction of reflected light, which is the portion of the emitted light reflected by the light reflecting face of a corresponding one of the first light reflecting member and the second light reflecting member, and
a non-reflected light passing region having a second lens shape configured to control a travelling direction of non-reflected light, which is the portion of the emitted light travelling outside the light reflecting face of at least one of the first light reflecting member and the second light reflecting member.

2. The light emitting device according to claim 1, wherein the first lens shape is configure to collimate the reflected light, and the second lens shape is configured to collimate the non-reflected light.

3. The light emitting device according to claim 1, wherein the first light emitting element, the first light reflecting member and the lens member are positioned so that at least a main portion of the reflected light does not pass through the non-reflected light passing region having the second lens shape.

4. The light emitting device according to claim 1, further comprising
a base having a planar face,
wherein the first light emitting element and the first light reflecting member are disposed on the planar face of the base.

5. The light emitting device according to claim 4, wherein the reflected light passing region having the first lens shape is a region through which the reflected light travelling away from the planar face of the base after being reflected by the light reflecting face passes, and
the non-reflected light passing region having the second lens shape is a region through which the non-reflected light travelling away from the planar face of the base passes without being incident on the light reflecting face.

6. The light emitting device according to claim 1, wherein the first lens part and the second lens part are linked to each other.

7. The light emitting device according to claim 1, wherein the non-reflected light passing region has the second lens shape in the first lens part,
the reflected light passing region and the non-reflected light passing region of the first lens part are linked to the reflected light passing region of the second lens part.

8. The light emitting device according to claim 7, wherein the non-reflected light passing region having the second lens shape is provided only in the first lens part and not in the second lens part.

9. The light emitting device according to claim 1, wherein at least an entire main portion of the emitted light from the second light emitting element irradiates the light reflecting face of the second light reflecting member.

10. The light emitting device according to claim 1, further comprising:
a third light emitting element configured to emit light; and
a third light reflecting member having a light reflecting face, the third light reflecting member formed integrally with or separately from the first light reflecting member and the second light reflecting member, and positioned with respect to the third light emitting element so that emitted light from the third light emitting element irradiates onto the light reflecting face of the third light reflecting member,
wherein the lens member further has a third lens part configured to control a travelling direction of the emitted light from the third light emitting element, and
the reflected light passing region has the first lens shape in the third lens part which is configured to control the travelling direction of reflected light which is the emitted light reflected by the third light reflecting member.

11. The light emitting device according to claim 10, wherein
the first light emitting element is configured to emit red light,
the second light emitting element is configured to emit blue light, and
the third light emitting element is configured to emit green light.

12. The light emitting device according to claim 11, wherein
the lens member is configured to emit collimated red light, collimated green light,
and collimated blue light.

13. The light emitting device according to claim 10, wherein the first to the third light emitting elements are semiconductor laser elements.

14. The light emitting device according to claim 1, wherein
a lower end of a vertical divergence of a main portion of the light emitted from the first light emitting element is present in the light reflecting face of the first light reflecting member.

15. The light emitting device according to claim 1, wherein
the emitted light from each of the first light emitting element and the second light emitting element has an elliptical far field pattern,
a sum of a half value of a lens length of the first lens part corresponding to a major diameter of an elliptical beam of the emitted light from the first light emitting element and a half value of a lens length of the second lens part corresponding to a major diameter of an elliptical beam of the emitted light from the second light emitting element is larger than a distance between the first light emitting element and the second light emitting element, and
widths of the first lens part and the second lens part corresponding to minor diameters of the elliptical beams are smaller than lengths of the first lens part and the second lens part corresponding to the major diameters of the elliptical beams, respectively.

16. The light emitting device according to claim 1, wherein
the reflected light passing region of the lens member is configured to allow the reflected light to exit from the first lens part without being reflected again in the lens member.

17. The light emitting device according to claim 1, wherein
the lens member has a planar incident face though which the reflected light and the non-reflected light enter the lens member, the incident face being arranged above the first light reflecting member and the second light reflecting member.

18. The light emitting device according to claim 1, wherein
the lens member is arranged with respect to the first light emitting element and the second light emitting element so that the first light emitting element and the second light emitting element are closer to the reflected light passing region than to the non-reflected light passing region.

19. The light emitting device according to claim 1, wherein
the reflected light passing region of the lens member overlaps emission end faces of the first light emitting element and the second light emitting element in a plan view.

* * * * *